United States Patent
Fontana et al.

(10) Patent No.: US 12,165,880 B2
(45) Date of Patent: Dec. 10, 2024

(54) METHOD OF MANUFACTURING SEMICONDUCTOR DEVICES AND CORRESPONDING SEMICONDUCTOR DEVICE

(71) Applicant: STMicroelectronics S.r.l., Agrate Brianza (IT)

(72) Inventors: Fulvio Vittorio Fontana, Monza (IT); Michele Derai, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 462 days.

(21) Appl. No.: 17/550,747

(22) Filed: Dec. 14, 2021

(65) Prior Publication Data
US 2022/0199424 A1 Jun. 23, 2022

(30) Foreign Application Priority Data
Dec. 18, 2020 (IT) .......................... 102020000031541

(51) Int. Cl.
*H01L 21/48* (2006.01)
*H01L 21/78* (2006.01)
*H01L 23/495* (2006.01)

(52) U.S. Cl.
CPC ...... *H01L 21/4828* (2013.01); *H01L 21/4832* (2013.01); *H01L 21/78* (2013.01); *H01L 23/49548* (2013.01); *H01L 23/49582* (2013.01)

(58) Field of Classification Search
CPC ................ H01L 21/4832; H01L 23/49–49596
See application file for complete search history.

(56) References Cited

U.S. PATENT DOCUMENTS

| | | |
|---|---|---|
| 2016/0276251 A1 | 9/2016 | Mustanir et al. |
| 2017/0040244 A1 | 2/2017 | Fontana |
| 2019/0385938 A1* | 12/2019 | Shi .......................... H01L 24/48 |

OTHER PUBLICATIONS

IT Search Report and Written Opinion for priority application, IT 102020000031541, report dated Sep. 8, 2021, 9 pages.

* cited by examiner

*Primary Examiner* — Daniel P Shook
(74) *Attorney, Agent, or Firm* — Crowe & Dunlevy LLC

(57) ABSTRACT

A semiconductor chip is mounted at a first surface of a leadframe and an insulating encapsulation is formed onto the leadframe. An etching mask is applied to a second surface of the leadframe to cover locations of two adjacent rows of electrical contacts as well as a connecting bar between the two adjacent rows which electrically couples the electrical contacts. The second surface is then etched through the etching mask to remove leadframe material at the second surface and define the electrical contacts and connecting bar. The electrical contacts include a distal surface as well as flanks left uncovered by the insulating encapsulation. The etching mask is then removed and the electrical contacts and the connecting bars are used as electrodes in an electroplating of the distal surface and the flanks of the electrical contacts. The connecting bar is then removed from between the two adjacent rows during device singulation.

16 Claims, 4 Drawing Sheets

METHOD OF MANUFACTURING SEMICONDUCTOR DEVICES AND CORRESPONDING SEMICONDUCTOR DEVICE

PRIORITY CLAIM

This application claims the priority benefit of Italian Application for Patent No. 102020000031541, filed on Dec. 18, 2020, the content of which is hereby incorporated by reference in its entirety to the maximum extent allowable by law.

TECHNICAL FIELD

The description relates to semiconductor devices.

One or more embodiments may be applied to semiconductor devices such as integrated circuits (ICs), for instance.

BACKGROUND

Quad Flat No-leads (QFN) packages having peripheral lands at the package bottom in order to provide electrical connection to a substrate such as a printed circuit board (PCB) are exemplary of semiconductor devices which may include contacts pre-plated (for instance, referred to in the art as pre-plated frames (PPF)) only at their bottom side.

Oxidized metal (copper, for instance) at contact flanks militates against contact solderability. Also, PPF contact metallization is adversely affected by prolonged exposure to the atmosphere (leading to nickel migration and discoloration) which adversely affects bondability.

It is noted that solder joint reliability is proportional to solder joint section, which is in turn proportional to the solderable area.

Increasing the solder joint section, that is the solderable area, by increasing the contact width impacts on contact pitch (less I/O pins available) and may increase the risk of migration, while also leading to creepage distance issues.

It is otherwise noted that conventional electroless plating of contacts (via electroless tin immersion, for instance) may achieve a tin thickness of 1.5-2.0 µm, which is much less than values of nearly 10 µm as desirable in the automotive sector, for instance.

There is a need in the art to provide improved solutions overcoming drawbacks of prior art solutions as discussed in the foregoing.

SUMMARY

One or more embodiments may relate to a method.

One or more embodiments may relate to a corresponding semiconductor device.

One or more embodiments provide a process to form wettable flanks (in multi-row Quad Flat No-leads (QFN) packages, for instance) where leadframe etching is performed through a mask and contact bars are formed to electrically connect the leads in the leadframe; this facilitates adequate tin electroplating of the leads with the (sacrificial) contact bars removed by sawing, before singulation.

One or more embodiments may simplify leadframe design and processing eliminating bottom-side pre-plating, which results in a lower leadframe cost.

In one or more embodiments, contact pads can be fabricated associating a masking process step with a standard etching process.

One or more embodiments facilitate plating contact pads, including the flanks, with a tin layer having a thickness of more than 5 microns, via an electroplating process, for instance.

In one or more embodiments, sacrificial tie bars can be removed with a (second) sawing step during final singulation. For instance, a (first) sawing blade can perform singulation and another sawing blade can be used for tie bar removal. The two sawing steps can be performed at least partly simultaneously.

BRIEF DESCRIPTION OF THE DRAWINGS

One or more embodiments will now be described, by way of example only, with reference to the annexed figures, wherein.

Figures 1A, 1B:
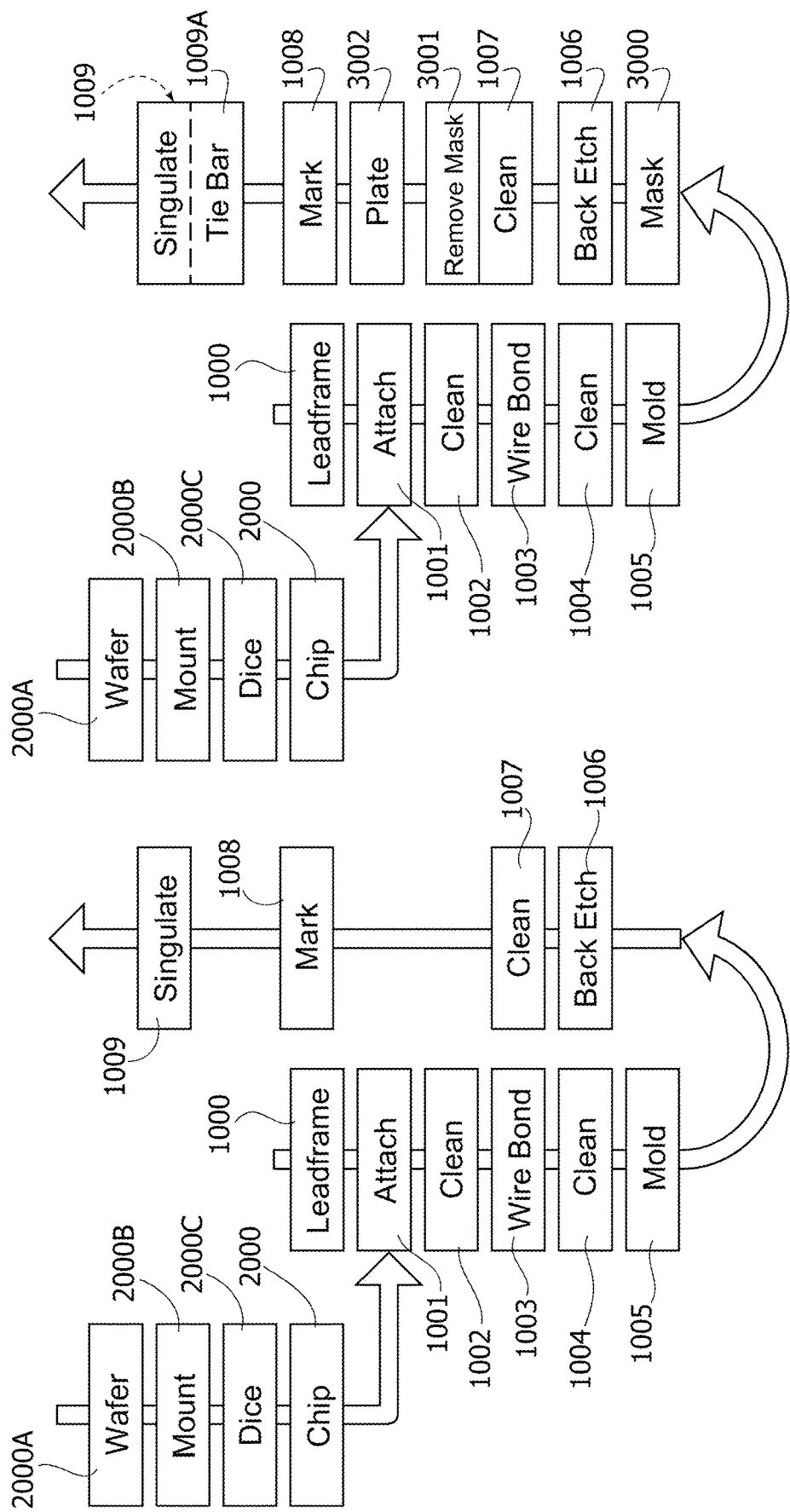
FIG. 1A is a flowchart illustrative of a conventional process flow in manufacturing semiconductor devices.
FIG. 1B is a flowchart illustrative of a process flow in manufacturing semiconductor devices including embodiments according to the present description.

It will be appreciated that, for the sake of clarity and ease of understanding, the various figures may not be drawn to a same scale.

DETAILED DESCRIPTION

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular conformations, structures, or characteristics may be combined in any adequate way in one or more embodiments.

The headings/references used herein are provided merely for convenience and hence do not define the extent of protection or the scope of the embodiments.

Also, throughout the figures, like parts or elements are indicated with like reference symbols, and a corresponding description will not be repeated for each and every figure for brevity.

Specifications in various sectors such as the automotive sector are increasingly moving towards tin pre-plated contacts in semiconductor device packages such as Quad Flat No-leads multi-row (QFN-mr) packages.

As discussed, oxidized metal (copper, for instance) at contact flanks in conventional semiconductor device packages where contacts are pre-plated only on bottom side militates against solderability. In fact, solder joint section and stand-off are a function of (e.g., proportional to) the solderable area. Solder joint reliability is a function of solder joint section, stand-off and stress distribution (mainly tangential).

Pre-plated frames ("PPF") plated only at their bottom side may suffer from undesired discoloration (copper oxidation and migration over Ni and Au layers) due to ambient storage.

An approach to improve solder joint reliability (in QFN-mr packages, for instance) may involve increasing the contact area.

At least in principle, such an increase may be pursued in different ways.

For instance, the contact width and the pitch between the contacts can be increased: as a result, the number of I/O contacts available for a same package size is reduced.

Also, the contact width can be increased without changing the pitch: as a result, spacing between contacts is reduced, with a risk of migration.

Another approach may involve increasing the contact length: this affects the creepage distance between contacts and a central exposed pad or the size of the die pad.

One or more embodiments may address the issues discussed in the foregoing via processing steps which can be easily integrated in a conventional process of manufacturing semiconductor devices such as QFN-mr packages.

Such a conventional process is illustrated in the functional flow chart of FIG. 1.

In a process exemplified in FIG. 1A, a leadframe as represented by block 1000 has applied (attached) thereon in a step 1001 one or more semiconductor chips or dice as represented by block 2000.

The designation leadframe (or lead frame) is currently used (see, for instance the USPC Consolidated Glossary of the United States Patent and Trademark Office) to indicate a metal frame which provides support for a semiconductor chip or die as well as electrical leads to couple the semiconductor chip or die to other electrical components or contacts.

Essentially, a leadframe comprises an array of electrically-conductive formations (leads) which from a peripheral location extend inwardly in the direction of the semiconductor chip or die, thus forming an array of electrically-conductive formations from the die pad having at least one semiconductor chip or die attached thereon. This may be via a die attach adhesive (a die-attach film or DAF, for instance).

Electrical coupling of the leads in the lead frame with the semiconductor chip or die may be via wires forming a wire-bonding pattern around the chip or die.

As represented in FIG. 1A, such a chip or die 2000 can be obtained starting from a semiconductor wafer 2000A, via "mounting" and dicing steps as represented by blocks 2000B and 2000C.

Following die attachment on the leadframe as represented by block 1001, a process as exemplified in FIG. 1A may include: plasma cleaning (block 1002), wire-bonding (block 1003), plasma cleaning (block 1004), molding an encapsulation of molding compound (an epoxy resin, for instance) onto the leadframe and the semiconductor chip(s) attached thereon (block 1005), back etching (block 1006), water jet cleaning (block 1007), laser marking (block 1008), and singulation to provide individual devices (block 1009).

Such a process is conventional in the art, which makes it unnecessary to provide a more detailed description herein, with the proviso that—as well known to those of skill in the art—in likewise conventional processes, certain steps as exemplified in FIG. 1A may be omitted or replaced by other steps or other steps may be added. Also, one or more steps in the process may be performed in an order different from the order exemplified in FIG. 1A.

One or more embodiments may contemplate changes of the process of FIG. 1A along the lines of FIG. 1B. These changes include: a masking step as represented by block 3000 between the molding step of block 1005 and the back etching of block 1006; a mask removal step as represented by block 3001; a plating step as represented by block 3002 between the water jet cleaning of block 1007 and the laser marking of block 1008; and the singulation step of block 1009 including a tie bar sawing act as represented by sub-block 1009A in FIG. 1B.

It is otherwise noted that illustrating embodiments as per the present description by way of comparison of FIG. 1A with FIG. 1B is merely for the sake of simplicity and ease of explanation.

Consequently, the fact that certain steps illustrated in FIG. 1B are indicated with the same reference symbols appearing in FIG. 1A (so that a corresponding description will not be repeated for brevity) does not imply that certain steps illustrated in FIG. 1B are necessarily performed in the same manner of the corresponding steps illustrated in FIG. 1A.

Also, just like in the case of the process illustrated in FIG. 1A, certain steps in the process as exemplified in FIG. 1B may be omitted or replaced by other steps, with other steps possibly added. Also, one or more steps in the process may be performed in an order different from the order exemplified in FIG. 1B.

Figure 2:
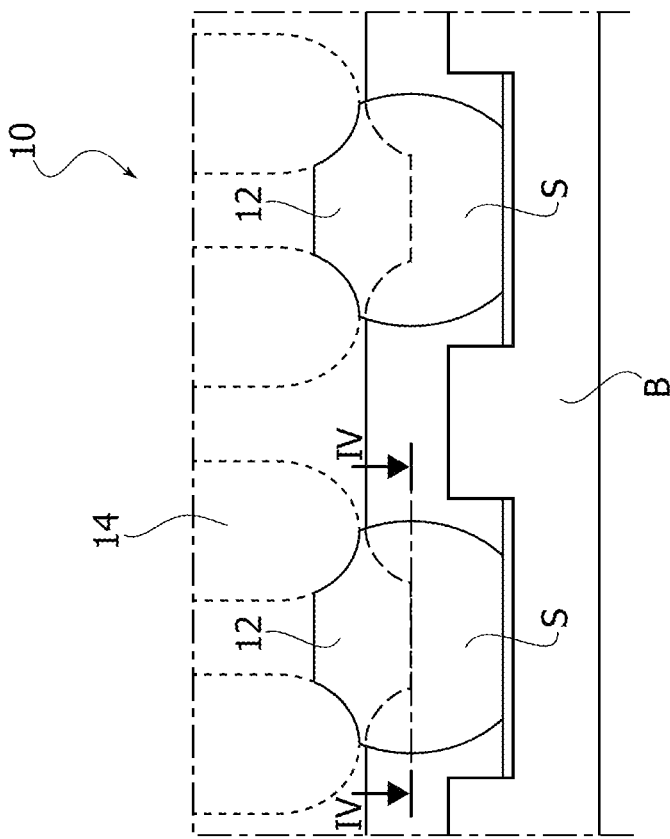
FIGS. 2, 3 and 4 are illustrative of contact plating and soldering embodiments according to the present description, with FIG. 4 being a cross-sectional view taken along line IV-IV of FIG. 3.
Figure 3:
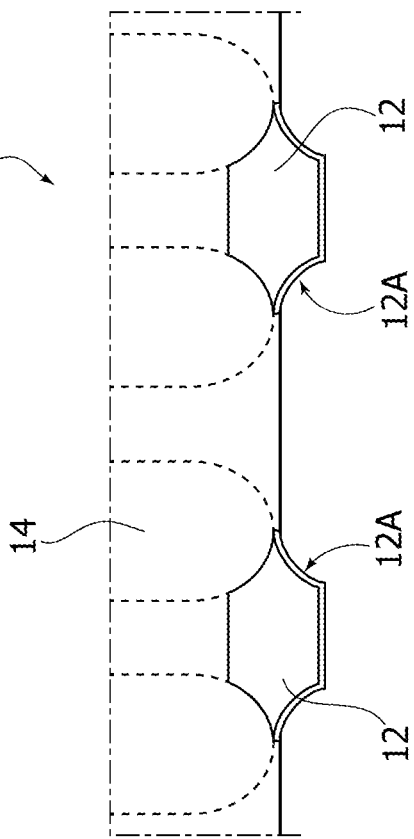

FIGS. 2 and 3 are illustrative of a semiconductor device 10 (such as a QFN-mr package, for instance) including contacts such leads 12 in a leadframe, which are plated (e.g., tin plated) as indicated at 12A both at their bottom (distal) surfaces and at their flanks.

For the sake of simplicity and ease of understanding, FIGS. 2 and 3 illustrate only a portion of the bottom or back surface of the device 10.

FIGS. 2 and 3 illustrate a pair of leads 12 protruding from an encapsulation 14 of electrically-insulating material (epoxy resin, for instance) molded or pre-molded onto the leadframe including the leads 12. Other possible features of the device 10 (such as wire bonding, for instance, are not visible for simplicity).

FIG. 3 is illustrative of the step of mounting the device 10 onto a support substrate B (a printed circuit board or PCB, for instance) which may occur via solder masses S.

The solder masses S may comprise material such as tin capable of "wetting" the leads 12 over their entire surface left exposed by the molding compound 14, namely both at the bottom (distal) surface and the flanks of the leads 12.

As exemplified in dashed lines in FIG. 3, the leads 12 being wettable also at their flanks by the solder mass S results in an increased section of the solder joints which couple (mechanically and electrically) the leads 12 to the support substrate B via the solder masses S.

Figure 4:
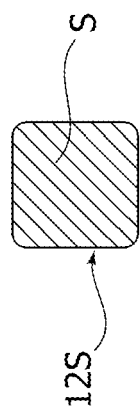

This is exemplified by the cross-sectional view of FIG. 4. This cross-sectional view, taken at an ideal plane IV-IV extending at the bottom (distal) surface of one of the leads 12, shows that, as a result of the surface tension effect related to "wetting" also the (plated) flanks, the solder mass S is coupled to the lead 12 over an area 12S which is considerably larger than the area the bottom (distal) surface of the leads 12.

As a result, solder masses S will be produced that are considerably larger than the solder masses produced when the leads 12 are plated only at their bottom surface.

These larger solder masses S are more resistant to tensile/tangential stresses.

Figure 5:
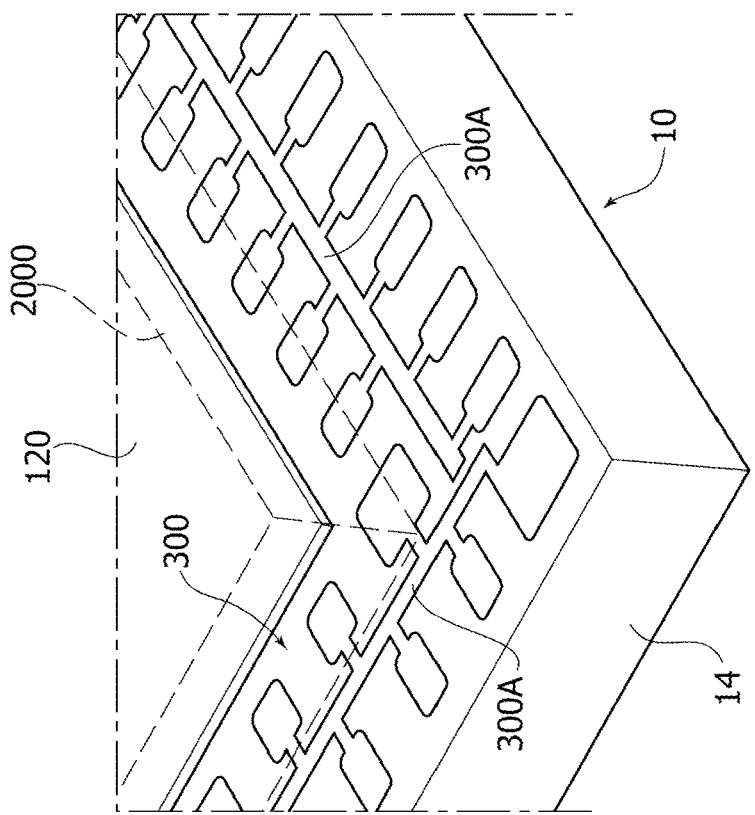

FIG. 5 is exemplary of a masking step such as the one exemplified at 3000 in FIG. 1B.

As illustrated, a mask 300 is applied to the bottom or back surface (facing upward in FIGS. 5 and 6) of the device 10, that is the surface opposed the top or front surface (facing downward in FIGS. 5 and 6) where one or more semiconductor chips 2000 are attached in the die attach step 1001 of FIGS. 1A and 1B to be encapsulated by a molding compound molded thereon in the molding step 1005 of FIGS. 1A and 1B.

Figure 6:
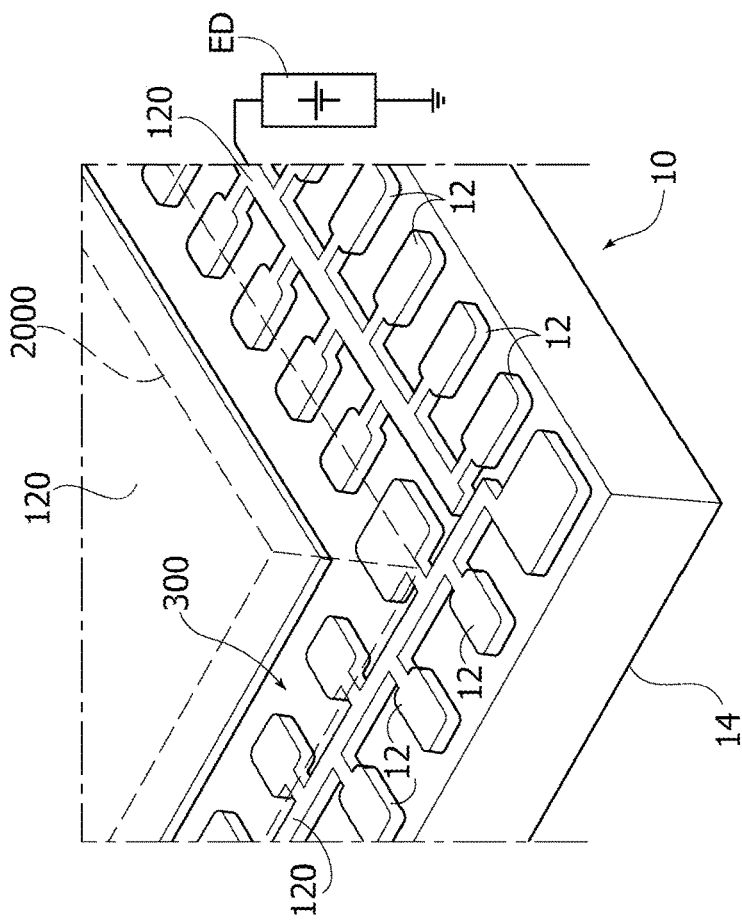
FIGS. 5, 6 and 7 are illustrative of various steps in a process according to embodiments of the present description.

The outline of such chip or chips 2000 (attached onto a die pad 120 in the leadframe which comprises the contacts or leads 120 is indicated in dashed lines in FIGS. 5 and 6.

As a result of the masking step at 3000, the back etching exemplified at 1006 will affect only those portions of the bottom or back surface of the leadframe which left exposed by the (e.g., water cleanable) mask 300.

In addition to mask covering the areas where the leads 12 are located, the mask 300 also covers areas 300A corresponding to connecting bars, which are intended to electrically connect (essentially as bus bars) the leads 12 (and, possibly, exposed pads/paddles in the leadframe), as located.

A mask such as 300 can be applied in a manner known per se to those of skill in the art, for instance via jet printing or mesh printing.

Water cleaning solder mask materials such as the mask materials available as Wondermask® W2205 (jet printing) and Wondermask® W2207 (mesh printing) with Techspray of 8125 Cobb Center Drive Kennesaw, GA 30152—USA can be advantageously used in embodiments.

Back etching exemplified at 1006 in FIG. 1B applied onto the bottom or back surface of the device 10 with the mask 300 applied in the step 3000 will result in the etching medium removing metal (copper, for instance) of the leadframe from the bottom or back surface of the device 10 with the exceptions of the contacts (leads) 12 and connecting bars 120 remaining at the areas 300A protected by the mask 300.

After etching as exemplified at 1006 in FIG. 1B, water jet cleaning at high pressure (250 bar, for instance) as exemplified at 1007 in FIG. 1B, will result in the mask 300 being also removed. For the sake of clarity, this is exemplified as a distinct block 3001 in FIG. 1B even though a single cleaning step will be involved.

Figure 7:
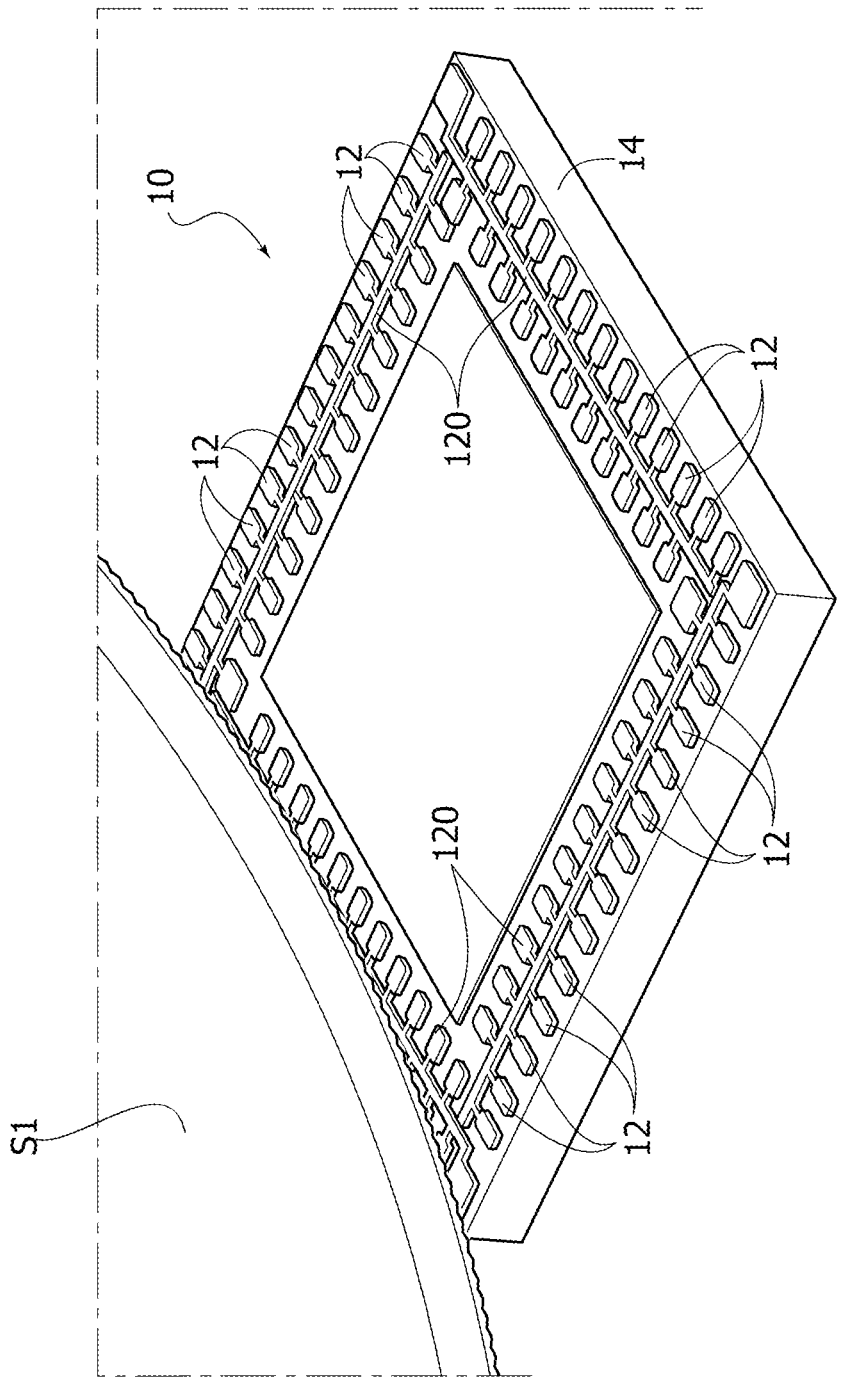

FIGS. 5, 6 and 7 show at least one semiconductor chip or die 2000 arranged at an area or portion of a (first) surface of a leadframe with an insulating encapsulation 14 formed onto the leadframe and the at least one semiconductor chip or die 2000 arranged thereon with two rows of leads 12 around the area where the one or more semiconductor chips 2000 are attached.

FIGS. 5, 6 and 7 also show that the connecting bars 120 at the areas 300A extend between, and are connected to, these two rows of leads 12 in a same leadframe portion, that is two rows of leads 12 of a same multi-row (two-row) array of leads 12 around an area where one or more semiconductor chips 2000 are attached.

This is in contrast with arrangements where such bars are provided merely as connecting parts between adjacent leadframe portions.

As a result, the plating step (electroplating with tin, for instance) exemplified at 3002 will be performed on a structure as exemplified in FIG. 7, that is with the contacts (leads) 12 in two adjacent rows of contacts which are electrically connected via the bar 120 positioned between the adjacent rows of contacts.

A plating layer will thus be electrodeposited (in a manner known per se to those of skill in the art, as exemplified by ED in FIG. 6) on the contacts 12.

Such deposition will include the flanks of the contacts 12 in both rows (namely both the inner one and the outer one), as exemplified at 12A in FIG. 2, insofar as the bars 120 facilitate all the contacts (leads such as 12 as well as exposed pads/paddles in the leadframe) in acting as anode in the electrodeposition process.

Electroplating will facilitate plating contacts such as 12 over their entire exposed surface (distal bottom surface plus flanks) with a plating thickness nearly 10 μm as desirable in the automotive sector, for instance.

The (sacrificial) tie bars 120 can be removed by sawing in possible combination with singulation.

As exemplified at 1009 and 1009A in FIG. 1B two steps performed using two blades can be involved.

As exemplified in FIG. 7, a first cutting act (1009A in FIG. 1B) using a first blade S1 (width 200 micron, for instance) dedicated to removing the connecting bars 120 in order to restore insulation of the contacts 12 as desired.

A second cutting act (1009 in FIG. 1B) using a second blade (width 350 micron, for instance) may be dedicated to singulation.

It is noted that such a distinction does not per se imply that these cutting acts should be performed in sequence.

For instance, one or more embodiments may advantageously involve: a first cutting step, with a first blade (width 200 micron, for instance) to remove half on tie bars (east/south side of modules); and a second cutting step, with still the first blade to remove the other half of the tie bars (west/north sides of modules) and a second blade performing singulation of the individual devices.

As visible in FIGS. 5 to 7, for instance, the connecting bars 120 at the areas 300A extend between, and are connected to, two rows of leads 12 in a same leadframe portion, that is two rows of leads 12 of a same multi-row (two-row) array of leads 12 around an area where one or more semiconductor chips 2000 are attached).

Consequently, even after removal of the sacrificial bars 120, the presence of wettable/solderable (e.g., tin) plated flanks in (both of) the two rows of leads or contacts such as 12 can be easily detected, via cross-sectioning the solder joints (S in FIG. 3). This will similarly permit to measure both the thickness of the (e.g., tin) plating on the flanks and the grain size which is indicative of the nature of the electroplating process.

In brief, a method as exemplified herein may comprise:

arranging (for instance, 1001) at least one semiconductor chip or die (for instance, 2000) at a first surface of a leadframe (for instance, 1000), wherein the leadframe has a second surface opposed the first surface;

forming or providing (for instance, 1005) an insulating encapsulation (for instance, 14) onto the leadframe having the at least one semiconductor chip or die arranged thereon at the first surface of the leadframe;

applying etching (for instance, 1006) at the second surface of the leadframe to provide electrical contacts (for instance, 12) for the at least one semiconductor chip or die, wherein the electrical contacts have a distal surface as well as well as flanks left uncovered by the insulating encapsulation, wherein said etching at the second surface of the leadframe is via an etching mask (for instance, 300) covering said electrical contacts as well as at least one (sacrificial)

connecting bar (for instance, 120) electrically coupling a plurality of said electrical contacts;

removing (for instance, 3001) the etching mask wherein the electrical contacts and the least one connecting bar are exposed;

electroplating (for instance, 3002) the distal surface as well as the flanks of the electrical contacts using the electrical contacts and the at least one connecting bar as electroplating electrodes (for instance, as the anode ED in the electroplating process); and removing (for instance, 1009, 1009A) the at least one connecting bar.

A method as exemplified herein may comprise removing (for instance, 1009A) the at least one connecting bar concurrently with applying singulation (for instance, 1009) to the leadframe to mutually separate plural semiconductor chips or dice arranged thereon.

A method as exemplified herein may comprise applying said etching mask via jet printing or mesh printing.

In a method as exemplified herein, said removing the etching mask may comprise water cleaning the etching mask.

In a method as exemplified herein, said electroplating may comprise tin electroplating of the distal surface as well as the flanks of the electrical contacts.

In a method as exemplified herein, said electroplating may comprise electroplating the distal surface as well as the flanks of the electrical contacts with a plated layer having a thickness of approximately 9.1 to 9.8 micrometers.

As used herein, the wording "approximately" denotes a technical feature being produced within the technical tolerance of the method used to manufacture it.

A method as exemplified herein may comprise mounting onto a substrate (for instance, a printed circuit board such as B) the leadframe with the insulating encapsulation formed onto the leadframe having the at least one semiconductor chip or die arranged thereon, wherein said mounting is via solder masses (for instance, S) wetting (both of) the electroplated distal surface and the flanks of the electrical contacts.

A semiconductor device as exemplified herein (for instance, 10) may comprise:

at least one semiconductor chip or die (for instance, 2000) arranged at a first surface of a leadframe (for instance, 1000), wherein the leadframe has a second surface opposed the first surface;

an insulating encapsulation (for instance, 14) formed (provided) onto the leadframe having the at least one semiconductor chip or die arranged thereon at the first surface of the leadframe; and electrical contacts (for instance, 12) for the at least one semiconductor chip or die etched (for instance, at 1006) at the second surface of the leadframe, wherein the electrical contacts have a distal surface as well as well as flanks left uncovered by the insulating encapsulation, wherein said distal surface as well as well as said flanks have a plating layer (for instance, 12A) electroplated (for instance, at 3002) thereon.

In a device as exemplified herein, the plating layer may comprise tin electroplated onto (both of) the distal surface as well as the flanks of the electrical contacts.

In a device as exemplified herein, the plating layer may comprise an electroplated layer having a thickness of approximately 9.1 to 9.8 micrometers.

Here again, as used herein, the wording "approximately" denotes a technical feature being produced within the technical tolerance of the method used to manufacture it.

Without prejudice to the underlying principles, the details and the embodiments may vary, even significantly, with respect to what has been described by way of example only without departing from the scope of the embodiments.

The claims are an integral part of the technical disclosure provided herein in connection with the embodiments.

The extent of protection is determined by the annexed claims.

The invention claimed is:

1. A method, comprising:
arranging a semiconductor chip or die at a first surface of a leadframe, wherein the leadframe has a second surface opposed to the first surface;
forming an insulating encapsulation onto the leadframe and the semiconductor chip or die arranged thereon;
applying an etching mask to cover the second surface of the leadframe at locations which include locations of a plurality of electrical contacts and a connecting bar electrically coupling electrical contacts of said plurality of electrical contacts to each other;
etching the second surface of the leadframe not covered by the etching mask to define the electrical contacts and the connecting bar, wherein the electrical contacts have a distal surface as well as flanks which are not covered by the insulating encapsulation;
removing the etching mask to expose the plurality of electrical contacts and the connecting bar;
electroplating the distal surface as well as the flanks of the electrical contacts while using the electrical contacts and the at least one connecting bar as electroplating electrodes; and
removing the at least one connecting bar to electrically isolate the electrical contacts from each other.

2. The method of claim 1, wherein removing the at least one connecting bar is performed concurrently with applying singulation to the leadframe to mutually separate plural semiconductor chips or dice arranged thereon.

3. The method of claim 1, wherein applying said etching mask comprises using one of jet printing or mesh printing.

4. The method of claim 1, wherein removing the etching mask comprises using water cleaning to remove the etching mask.

5. The method of claim 1, wherein electroplating comprises tin electroplating of the distal surface as well as the flanks of the electrical contacts with a plated layer.

6. The method of claim 5, wherein the plated layer has a thickness of approximately 9.1 to 9.8 micrometers.

7. The method of claim 1, further comprising mounting the leadframe with the insulating encapsulation onto a substrate via solder masses wetting the electroplated distal surface and the flanks of the electrical contacts.

8. The method of claim 1, wherein the plurality of electrical contacts are arranged in two adjacent rows and wherein the connecting bar is positioned between said two adjacent rows and configured to electrically couple the electrical contacts of the two adjacent rows to each other.

9. The method of claim 8, wherein removing the at least one connecting bar electrically disconnects the electrical contacts of the two adjacent rows from each other.

10. A method, comprising:
arranging a semiconductor chip or die at a first surface of a leadframe, wherein the leadframe has a second surface opposed to the first surface;
forming an insulating encapsulation onto the leadframe and the semiconductor chip or die arranged thereon;
applying an etching mask to cover, at the second surface of the leadframe, locations for a first row of electrical contacts, a second row of electrical contacts and a connecting bar between the first and second rows of electrical contacts which electrically couples said first and second rows of electrical contacts;

etching the second surface of the leadframe not covered by the etching mask to define the first and second rows of electrical contacts and the connecting bar, wherein each electrical contact of the first and second rows of electrical contacts has a distal surface as well as flanks which are not covered by the insulating encapsulation;

removing the etching mask to expose the first and second rows of electrical contacts and the connecting bar;

electroplating the distal surface as well as the flanks of each electrical contact of the first and second rows of electrical contacts while using the electrical contacts and the at least one connecting bar as electroplating electrodes; and removing the at least one connecting bar to electrically isolate the electrical contacts of the first row of electrical contacts from the electrical contacts of the second row of electrical contacts.

11. The method of claim 10, wherein removing the at least one connecting bar is performed concurrently with applying singulation to the leadframe to mutually separate plural semiconductor chips or dice arranged thereon.

12. The method of claim 10, wherein applying said etching mask comprises using one of jet printing or mesh printing.

13. The method of claim 10, wherein removing the etching mask comprises using water cleaning to remove the etching mask.

14. The method of claim 10, wherein electroplating comprises tin electroplating of the distal surface as well as the flanks of the electrical contacts with a plated layer.

15. The method of claim 14, wherein the plated layer has a thickness of approximately 9.1 to 9.8 micrometers.

16. The method of claim 10, further comprising mounting the leadframe with the insulating encapsulation onto a substrate via solder masses wetting the electroplated distal surface and the flanks of the electrical contacts.

* * * * *